(12) United States Patent
Fricke et al.

(10) Patent No.: US 6,940,085 B2
(45) Date of Patent: Sep. 6, 2005

(54) MEMORY STRUCTURES

(75) Inventors: Peter Fricke, Corvallis, OR (US);
Andrew Koll, Albany, OR (US);
Dennis M. Lazaroff, Corvallis, OR
(US); Andrew L. Van Brocklin,
Corvallis, OR (US)

(73) Assignee: Hewlett-Packard Development Company, I.P., Houston, TX (US)

( * ) Notice: Subject to any disclaimer, the term of this patent is extended or adjusted under 35 U.S.C. 154(b) by 0 days.

(21) Appl. No.: 10/115,744

(22) Filed: Apr. 2, 2002

(65) Prior Publication Data

US 2003/0183867 A1 Oct. 2, 2003

(51) Int. Cl.[7] .......................... H01L 47/00; H01L 29/00
(52) U.S. Cl. ......................... 257/4; 257/530; 257/529;
257/3; 365/163; 365/174; 365/145; 365/158;
365/170
(58) Field of Search ........................ 257/2–4, 50, 529,
257/530, 278, 75, 315, 316, 296, 314, 326,
105, 301, 478; 365/163, 174, 145, 158,
170, 175, 94, 96, 103, 104, 105, 177

(56) References Cited

U.S. PATENT DOCUMENTS

| | | | |
|---|---|---|---|
| 3,271,591 A | | 9/1961 | Ovshinsky .................. 307/88.5 |
| 3,530,441 A | | 9/1970 | Ovshinsky .................. 340/173 |
| 3,641,516 A | | 2/1972 | Castrucci et al. ...... 340/173 SP |
| 4,499,557 A | | 2/1985 | Holmberg et al. .......... 365/163 |
| 4,599,705 A | | 7/1986 | Holmberg et al. .......... 365/163 |
| 4,651,409 A | * | 3/1987 | Ellsworth et al. ........... 438/207 |
| 5,309,392 A | * | 5/1994 | Ootsuka et al. ............. 365/145 |
| 5,335,219 A | | 8/1994 | Ovshinsky et al. ......... 369/288 |
| 5,374,832 A | * | 12/1994 | Tung et al. ................... 257/50 |
| 5,449,947 A | * | 9/1995 | Chen et al. .................. 257/530 |
| 5,534,712 A | * | 7/1996 | Ovshinsky et al. ............. 257/3 |
| 5,572,050 A | * | 11/1996 | Cohen ......................... 257/209 |
| 5,625,220 A | | 4/1997 | Liu et al. .................... 257/530 |
| 5,659,500 A | | 8/1997 | Mehrad ................. 365/185.05 |
| 5,751,012 A | * | 5/1998 | Wolstenholme et al. ........ 257/5 |
| 5,821,558 A | | 10/1998 | Han et al. ..................... 257/52 |
| 5,835,396 A | | 11/1998 | Zhang .......................... 365/51 |
| 5,942,777 A | | 8/1999 | Chang ........................ 257/296 |
| 6,002,607 A | | 12/1999 | Dvir ........................... 365/103 |
| 6,026,017 A | | 2/2000 | Wong et al. ........... 365/185.05 |
| 6,033,955 A | | 3/2000 | Kuo et al. ................... 438/257 |
| 6,034,882 A | | 3/2000 | Johnson et al. ............. 365/103 |
| 6,111,302 A | | 8/2000 | Zhang et al. ............... 257/530 |
| 6,185,121 B1 | | 2/2001 | O'Neill ........................ 365/94 |
| 6,185,122 B1 | | 2/2001 | Johnson et al. ............. 365/103 |
| 6,351,406 B1 | | 2/2002 | Johnson et al. ............. 365/103 |
| 6,541,792 B1 | * | 4/2003 | Tran et al. ..................... 257/50 |
| 2001/0011776 A1 | | 8/2001 | Igarashi et al. ............. 257/776 |
| 2001/0055838 A1 | | 12/2001 | Walker et al. .............. 438/129 |

OTHER PUBLICATIONS

Victor W.C. Chan et al., "Multiple Layers of CMOS Inegrated Circuits Using Recrystalized Silicon Film" IEEE Electron Device Letters, V. 22, No. 2 (Feb. 2001) pp. 77–79.
Thomas H. Lee, "A Vertical Leap for Microchips," Scientific American, Jan. 2002, pp. 53–59.

(Continued)

Primary Examiner—Tom Thomas
Assistant Examiner—Matthew C Landau (57) ABSTRACT

A memory structure that includes a first electrode, a second electrode, a third electrode, a control element disposed between the first electrode and the second electrode, and a memory storage element disposed between the second electrode and the third electrode. At least one of the control element and memory storage element is protected from contamination by at least one of the first electrode, second electrode and third electrode.

15 Claims, 11 Drawing Sheets

OTHER PUBLICATIONS

Esmat Hamdy et al., "Dielectric based antifuses for logic and memory ICs" IEEE International Electron Devices Meeting, IEDM 88 (Aug. 1988) pp. 786–789.

Chenming Hu, "Interconnect devices for field programmable gate array." IEEE International Electron Devices Meeting, IEDM 92 (Apr. 1992) pp. 591–594.

Jonathan Green et al., "Antifuse Field Programmable Gate Arrays" Proc. IEEE vol. 81 No. 7 (Jul. 1993), pp. 1042–1056.

Vivek D. Kulkarni et al. "Patterning of Submicron Metal Features and Pillars in Multilevel Metalization" J. Electrochem. Soc. vol. 135 No. 12 (Dec. 1988) pp. 3094–3098.

* cited by examiner

MEMORY STRUCTURES

BACKGROUND OF THE DISCLOSURE

As computer and other electrical equipment continue to drop in price, the manufacturers of storage devices, such as memory devices and hard drives, are forced to lower the cost of their components. At the same time, computer, video game, television and other electrical device markets are requiring increasingly larger amounts of memory to store images, photographs, videos, movies, music and other storage intensive data. Thus, besides reducing cost, manufacturers of storage devices must also increase the storage density of their devices. Memory storage is implemented in a variety of memory technologies such as floppy drives, hard drives, optical drives, and semiconductor memories. Semiconductor memories can be implemented using integrated circuit processes, and a consideration with integrated circuit processes is the need to avoid contamination which reduces yield. There is accordingly a need for semiconductor memory structures that can be efficiently made.

SUMMARY

Various embodiments of memory structures, as described in more detail hereinafter, are disclosed.

BRIEF DESCRIPTION OF THE DRAWINGS

The features and advantages of the disclosure will readily be appreciated by persons skilled in the art from the following detailed description when read in conjunction with the drawing wherein.

DETAILED DESCRIPTION OF THE DISCLOSURE

Figure 1:
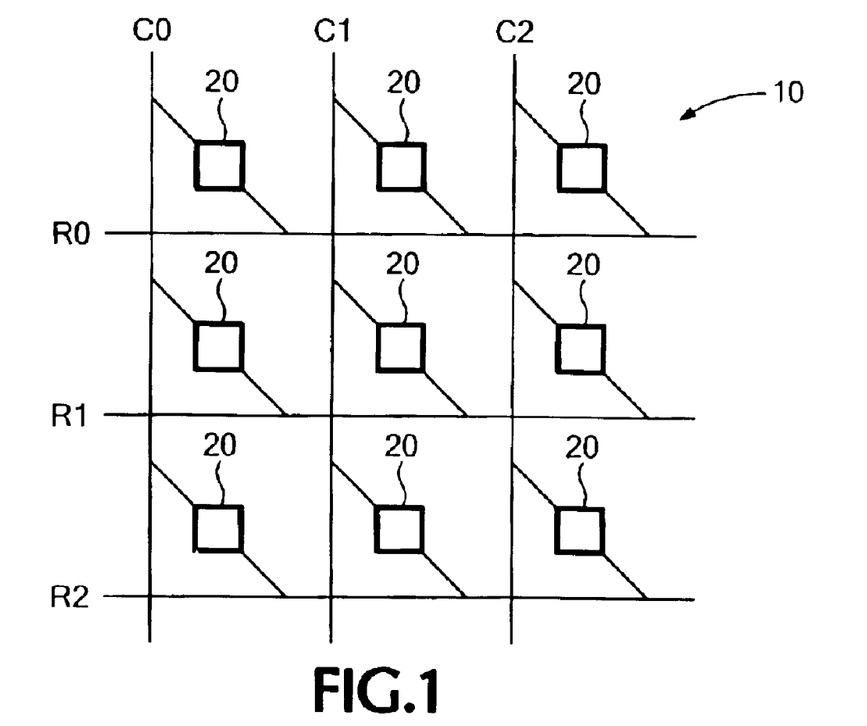
FIG. 1 is a schematic diagram of an embodiment of a cross-point memory array in which the disclosed memory cell structures can be utilized.

FIG. 1 is a simplified schematic diagram of an embodiment of a cross-point memory array 10 in which the disclosed memory cell structures can be utilized. The memory arrangement 10 includes row selection conductor lines R0, R1, R2 and column selection conductor lines C0, C1, C2. A memory cell 20 is connected between each row selection conductor line R0, R1, R2 and each column selection conductor line C0, C1, C2. It should be appreciated that the row selection conductor lines and the column selection conductor lines are referred to by "row" and "column" terminology for convenience, and that in actual implementations the memory cells 20 do not necessarily have to be physically arranged in rows and columns. Each memory cell is basically uniquely accessed or selected by a first selection line and a second selection line that can be oriented in different ways. Also, the column lines do not have to be orthogonal to the row lines, but are illustrated in that manner for ease of understanding.

Figure 2:
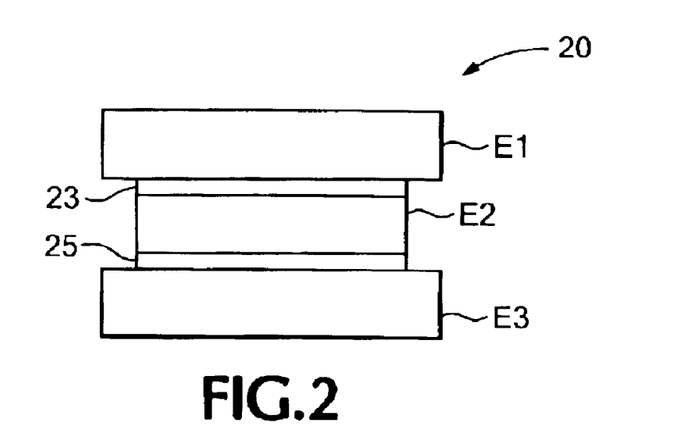
FIG. 2 is a schematic block diagram of a memory cell that includes a memory storage element and a control element for the memory storage element.

FIG. 2 is a simplified electrical block diagram of an embodiment of the memory cell 20 which includes a memory storage element 23 that is electrically connected to a control element 25 by an electrode E2. The memory storage element 23 and the control element 25 are serially connected between an electrode E1 and an electrode E3. The electrodes E1–E3 are conductive elements such as conductors, conductive regions or other conductive features, and it should be appreciated that the electrode E2 can be formed of one or more electrically conductive elements.

The memory storage element is more particularly configured to predictably and reliably break down at a lower energy level than the control element, while the control tunnel junction region is more particularly configured for sustained operation as a control element for the memory. Thus, the memory storage element 23 changes state at a lower energy level than the control element 25, which allows the memory storage element to be programmed. In this manner, a memory cell is programmed by selectively providing sufficient energy to the cell to cause the memory storage element to break down. A memory cell is read by providing a lesser amount of energy to the memory cell and sensing whether current flows through the cell.

The memory storage element 23 can be an antifuse device, such as a programmable tunnel junction device. The antifuse device can be either a dielectric rupture type device or a tunnel junction device. The tunnel junction can be formed from oxidized metal, thermally grown oxide, or deposited oxides or nitrides. The memory storage element may also be embodied with semiconductor materials such as polysilicon, polycrystalline silicon, amorphous silicon, microcrystalline silicon, metal filament electro migration, trap induced hysterisis, ferroelectric capacitor, Hall effect, and polysilicon resistors. Other embodiments of the memory storage element include tunneling magneto-resistive or capacitive elements as floating gates. Still further, the memory storage element can be a read only LeComber or silicide switch or a re-writable phase-change material including a write-erase-write phase change material. The memory storage element can also be a PIN diode or a Schottky diode.

The control element 25 can be a tunnel junction device or PN, PIN or Schottky diodes. Other diodes that can be used include Zener diodes, avalanche diodes, tunnel diodes, and a four layer diode such as a silicon controlled rectifier. Also, the control element 25 can be a junction field effect or bipolar transistor. The control element 25 is sized sufficiently to carry an adequate current such that the state of the storage element 23 can be changed. When the control element is a diode, it can be formed using doped polysilicon, amorphous silicon, or microcrystalline silicon.

For ease of discussion, the disclosed memory structures are described, by way of illustrative examples, as employing tunnel junction devices as the memory storage elements and control elements, and it should be appreciated that the memory storage elements and control elements can be implemented as described above.

By way of illustrative examples, the disclosed memory structures are schematically depicted as integrated circuits that include interlayer dielectric such as silicon dioxide, silicon nitride, or TEOS (tetraethylorthosilicate) that provide support and isolation between various structures of an integrated circuit. The ILD can be deposited using several different technologies such as chemical vapor deposition (CVD), atmospheric pressure CVD, low pressure CVD, plasma enhanced CVD, physical vapor deposition (PVD), and sputtering. For convenience, regions and layers of such dielectric are identified in the drawings by the reference designation ILD.

In the disclosed memory structures, at least one of the memory storage element 23 and the control element 25 is buried or non-etched since such element is formed without being subjected to further processing such as etching. For example, the buried element can be formed on an electrode without being etched, and is capped, covered or buried by another electrode that completely overlaps the buried element and can for example extend beyond a portion of the perimeter of the buried element. In this manner, the later formed covering electrode protects the buried element from contamination during subsequent processing and after completion of manufacture. Having the protection of a protective electrode during further processing, which can increase yield in the manufacture of the memory structures. By way of specific example, the layer in which the buried or covered element is formed is not etched in the process of making the memory structure. Also, the buried element can be more particularly configured such that it can be covered or capped with an electrode without being etched before such electrode is deposited.

Figure 3:
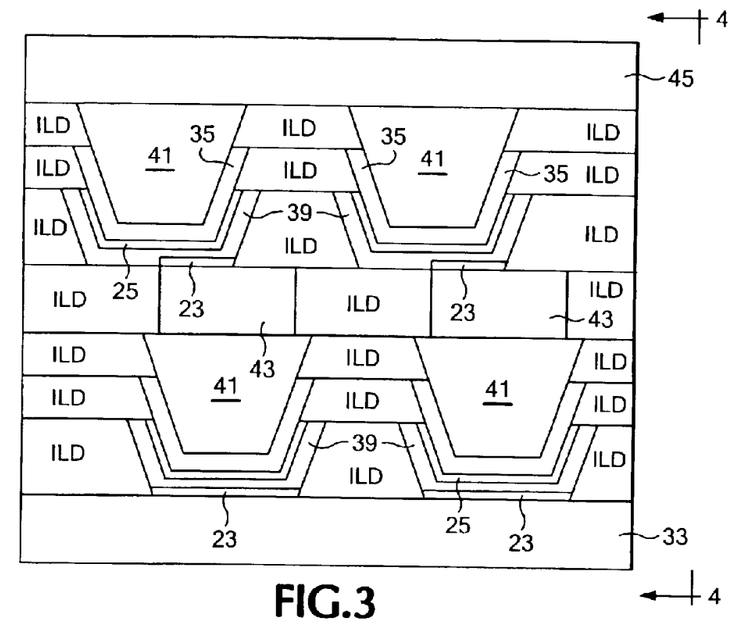
FIGS. 3 and 4 are sectional views that schematically depict an embodiment of a memory structure that includes a buried memory storage element disposed between a conductor and a base of a conductive well.
Figure 4:
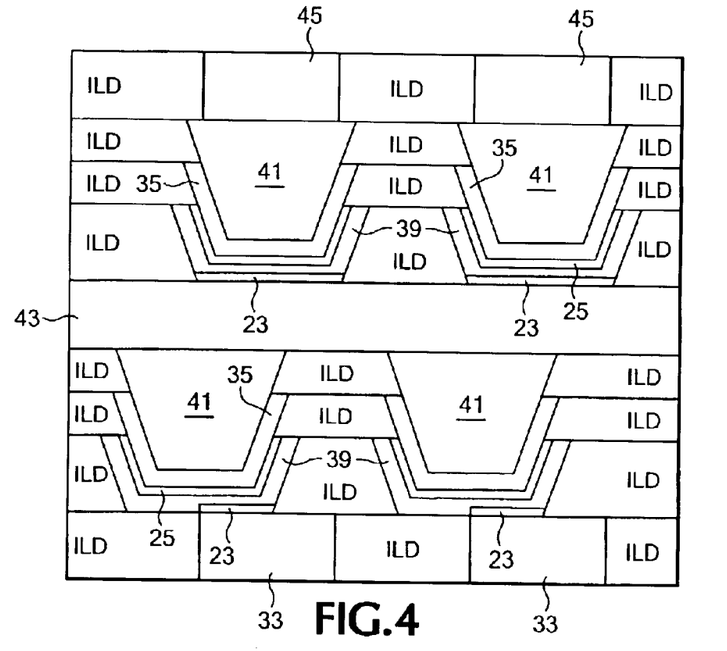

FIGS. 3 and 4 schematically depict an embodiment of a memory structure that includes a plurality of memory cells each including a memory storage element 23 disposed between a conductor 33 or 43 and an outside surface of the base of a conductive tub or well 39 that is vertically adjacent the conductor 33 or 43. Each memory cell further includes a control element 25 disposed between the inside surface of the well 39 and an outside surface of a conductive tub or well 35 that is nested in the conductive tub 39. A vertical conductive via, plug or pillar 41 is contactively nested in the conductive tub 35 and is in contact with a vertically adjacent conductor 43 or 45.

The memory cells of FIGS. 3 and 4 can be implemented in stacked layers or levels for example wherein a conductor 43 that is vertically adjacent the base of a given conductive tub 39 is vertically adjacent a conductive via of an adjacent layer.

By way of illustrative example, the conductors 43 can be row selection lines while the conductors 33, 45 can be column selection lines in a cross-point memory structure. Also by way of illustrative example, a conductive tub 39 can be laterally offset relative to the conductor 33 or 43 that is vertically adjacent the base thereof. As a result, a conductive tub 39 is laterally offset relative to another vertically adjacent conductive tub 39 in an adjacent layer.

The memory element 23 can be formed of an oxide of the conductor 33 or 43 that is vertically adjacent the base of the conductive tub 39, and the control element 25 can be formed of an oxide of the conductive tub 39. Alternatively, the memory storage element 23 can be formed of an oxide that is different from an oxide of the conductor 33 or 43, and the control element 25 can be formed of an oxide that is different from an oxide of the conductive tub 39. The memory storage element 23 can also be a portion of an unpatterned oxide layer that can be a deposited oxide layer or a completely oxidized deposited metal layer, for example. Similarly, the control element 25 can be a portion of an unpatterned oxide layer that can be a deposited oxide layer or a completely oxidized deposited metal layer, for example.

Figure 5:
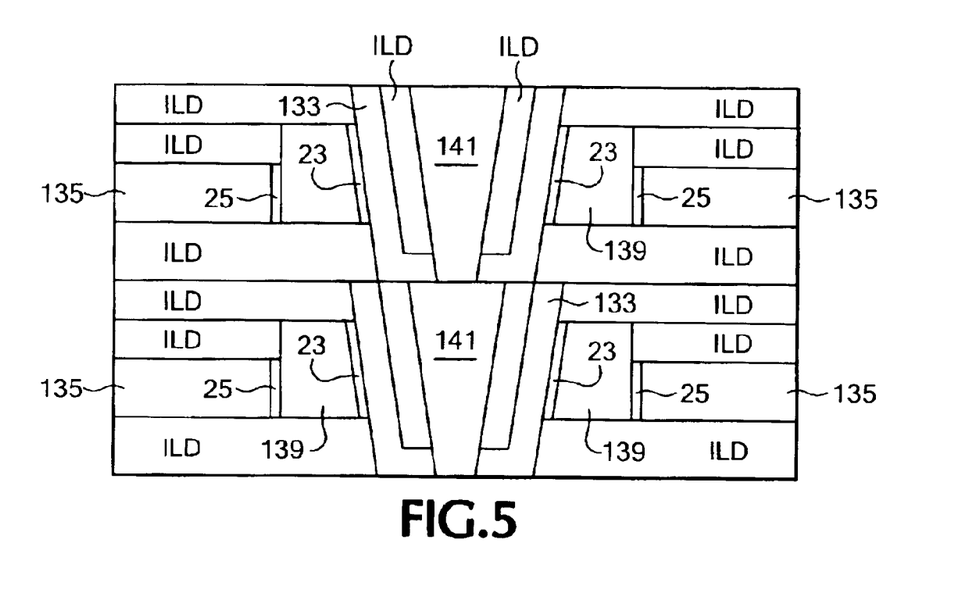
FIG. 5 is a sectional view and FIG. 6 is a plan view that schematically depict an embodiment of a memory structure that includes a buried memory storage element disposed between a conductive block and a side of a conductive well.
Figure 6:
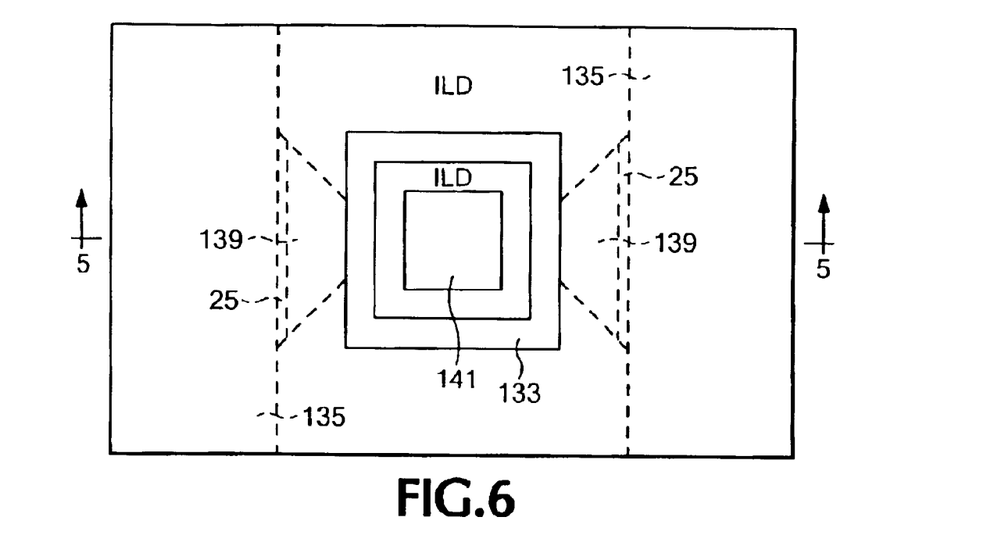

FIGS. 5 and 6 schematically depict an embodiment of a memory structure that includes memory cells each including a memory storage element 23 disposed between a conductive well or tub 133 and a conductive region or block 139 that is laterally adjacent the conductive tub 133. A control element 25 is disposed between the conductive block 139 and a conductor 135 that is laterally adjacent the conductive block 139. The memory storage element 23 and the control element 25 of a memory cell of FIGS. 5 and 6 are thus horizontally separated and each can be planar with a vertical extent. The conductive block 139 can be a truncated wedge, and the memory storage element 23 and the control element 25 are in contact with opposing faces of the truncated wedge. A vertical conductive via or pillar 141 is disposed in the conductive well 133, and can extend through an aperture in the base of the conductive tub 133. The conductive pillar 141 and the conductive tub 133 form a conductive structure having a vertical extent.

As shown in FIGS. 5 and 6, memory cells can be formed on opposite sides of a conductive tub 133. Also, the memory cells can be formed in layers wherein a layer includes horizontally arranged conductive tubs 133 and memory cells, and wherein the layers are stacked so that corresponding conductive pillars 141 of different layers are stacked to form columns of conductive pillars 141. The columns of conductive pillars 141 can comprise vertical memory selection lines of a cross-point memory structure, while the conductors 135 can comprise row memory selection lines.

The memory storage element 23 can formed of an oxide of the laterally contiguous conductive block 139 while the control element 25 can be formed of an oxide of the laterally contiguous conductor 135. Alternatively, the memory storage element 23 can be formed of an oxide that is different from an oxide of the conductive block 139, and the control element 25 can be formed of an oxide that is different from an oxide of the conductor 135. The memory storage element 23 can also be a portion of an unpatterned oxide layer that can be a deposited oxide layer or a completely oxidized deposited metal layer, for example. Similarly, the control element 25 can be a portion of an unpatterned oxide layer that can be a deposited oxide layer or a completely oxidized deposited metal layer, for example.

Figure 7:
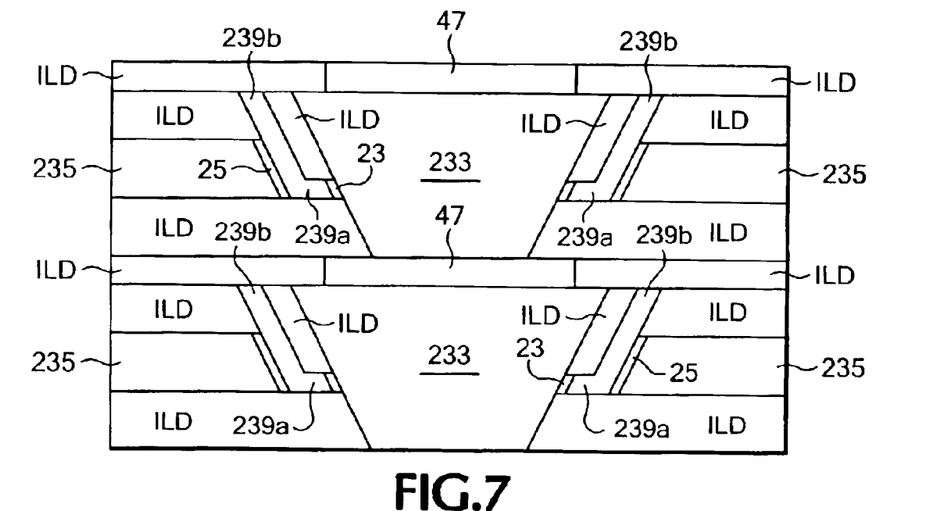
FIG. 7 is a sectional view and FIG. 8 is a plan view that schematically depict an embodiment of a memory structure that includes a buried memory storage element disposed between an edge of a conductive plate and a conductive pillar.
Figure 8:
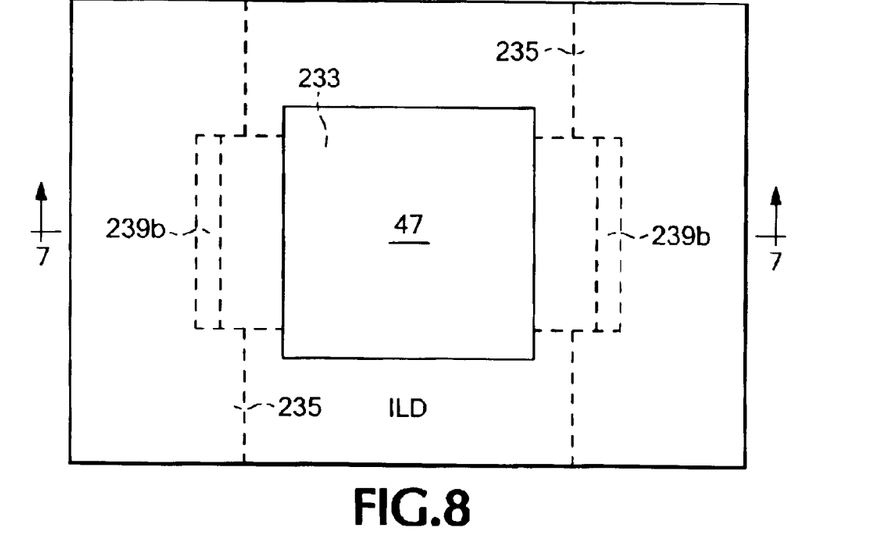

FIGS. 7 and 8 schematically depict an embodiment of a memory structure that includes memory cells each including a memory storage element 23 disposed between a conductive via or pillar 233 and an edge of a horizontal conductive plate 239*a*. A non-horizontal conductive panel 239*b* is connected to and laterally adjacent the horizontal conductive plate 239*a*, and a control element 25 is disposed between a face of the non-horizontal conductive panel 239*b* and a conductor 235 that is laterally adjacent the non-horizontal conductive panel 239*b*. A via cap 47 comprising for example gold or titanium nitride is disposed on the top of the conductive pillar 233.

As shown in FIGS. 7 and 8, memory cells can be formed on opposite sides of a conductive pillar 233. Also, the memory cells can be formed in layers wherein a layer includes horizontally arranged conductive pillars 233 and memory cells, and wherein the layers are stacked so that corresponding conductive pillars 233 of different layers are stacked to form columns of conductive pillars 233. The columns of conductive pillars 233 can be vertical memory selection lines of a cubic memory structure, while the conductors 235 can be row memory selection lines. In a cubic memory structure, row and column memory selection lines are arranged in a 3-D structure, for example as disclosed in commonly assigned, co-pending U.S. application Ser. No. 10/116,213, filed concurrently herewith on Apr. 2, 2002.

The memory storage element 23 can be formed of an oxide of the laterally contiguous horizontal plate 239*a* while the control element 25 can be formed of an oxide of the laterally contiguous conductor 235. Alternatively, the memory storage element 23 can be formed of an oxide that is different from an oxide of the horizontal plate 239*a*, and the control element 25 can be formed of an oxide that is different from an oxide of the conductor 235. The memory storage element 23 can also be a portion of an unpatterned oxide layer that can be a deposited oxide layer or a completely oxidized deposited metal layer, for example. Similarly, the control element 25 can be a portion of an unpatterned oxide layer that can be a deposited oxide layer or a completely oxidized deposited metal layer, for example.

Figure 9:
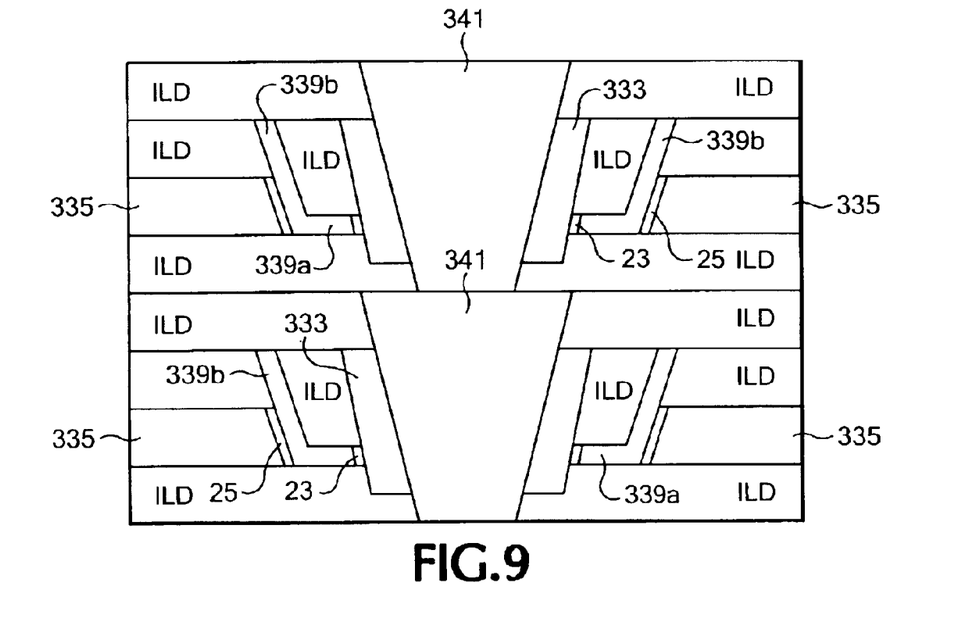
FIG. 9 is a sectional view and FIG. 10 is a plan view that schematically depict an embodiment of a memory structure that includes a buried memory storage element disposed between an edge of a conductive plate and a conductive well.
Figure 10:
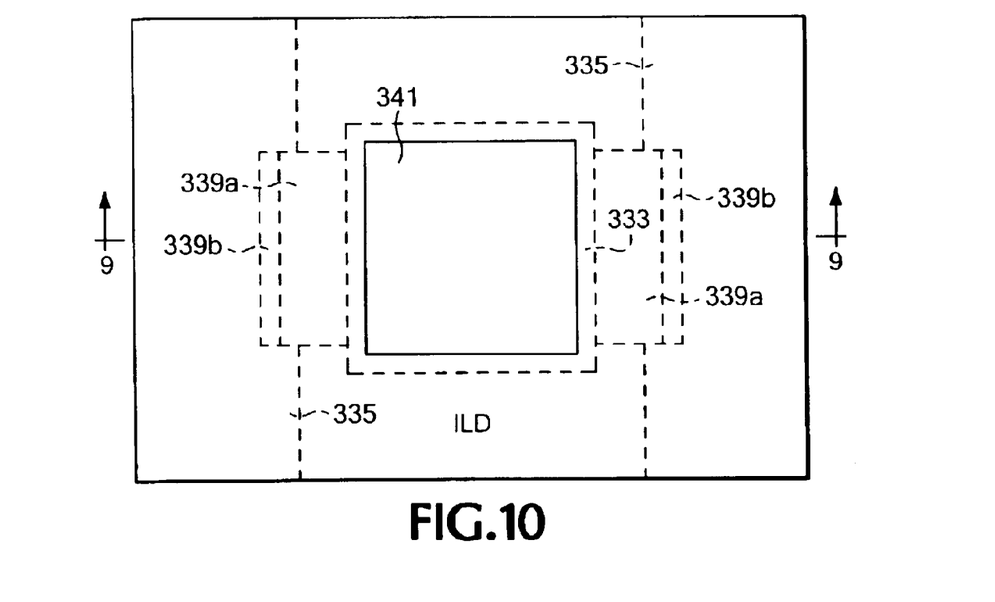

FIGS. 9 and 10 schematically depict an embodiment of a memory structure that includes memory cells each including a memory storage element 23 disposed between a conductive tub 333 and an edge of a horizontal conductive plate 339*a*. A non-horizontal conductive panel 339*b* is connected to and laterally adjacent the horizontal conductive plate 339*a*, and a control element 25 is disposed between a face of the non-horizontal conductive panel 339*b* and a conductor 335 that is laterally adjacent the non-horizontal conductive panel 339*b*. A vertical conductive via or pillar 341 is nested in the interior of the conductive tub 333 and passes through an aperture in the base of the conductive tub 333. The conductive pillar 341 and the conductive tub 333 form a conductive structure having a vertical extent.

As shown in FIGS. 9 and 10, memory cells can be formed on opposite sides of a conductive tub 333. Also, the memory cells can be formed in layers wherein a layer includes horizontally arranged conductive pillars 341 and memory cells, and wherein the layers are stacked so that corresponding conductive pillars 341 of different layers are stacked to form columns of conductive pillars 341. The columns of conductive pillars 341 can be vertical memory selection lines of a cubic memory structure, while the conductors 335 can be row memory selection lines.

The memory storage element 23 can be formed of an oxide of the laterally contiguous horizontal plate 339*a* while the control element 25 can be formed of an oxide of the laterally contiguous conductor 335. Alternatively, the memory storage element 23 can be formed of an oxide that is different from an oxide of the horizontal plate 339*a*, and the control element 25 can be formed of an oxide that is different from an oxide of the conductor 335. The memory storage element 23 can also be a portion of an unpatterned oxide layer that can be a deposited oxide layer or a completely oxidized deposited metal layer, for example. Similarly, the control element 25 can be a portion of an unpatterned oxide layer that can be a deposited oxide layer or a completely oxidized deposited metal layer, for example.

Figure 11:
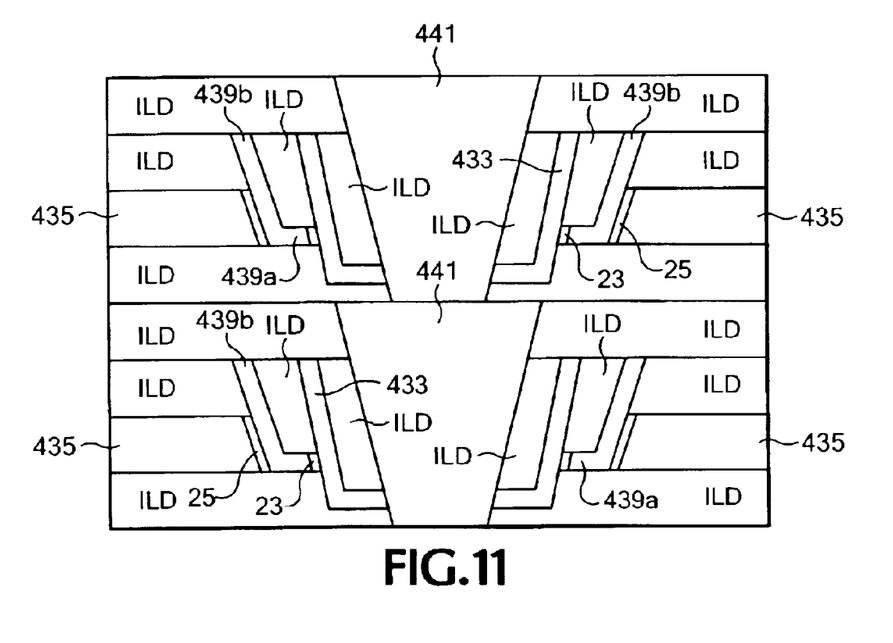
FIG. 11 is a sectional view and FIG. 12 is a plan view that schematically depict an embodiment of a memory structure that includes a buried memory storage element disposed between an edge of a conductive plate and a conductive well.
Figure 12:
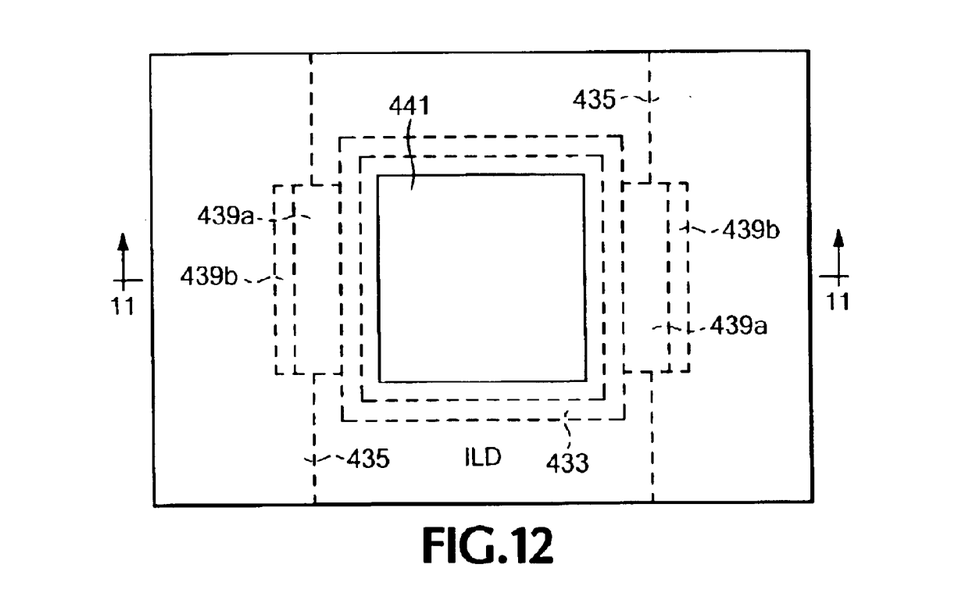

FIGS. 11 and 12 schematically depict an embodiment of a memory structure that includes memory cells each including a memory storage element 23 disposed between a conductive tub 433 and an edge of a horizontal conductive plate 439*a*. A non-horizontal conductive panel 439*b* is connected to and laterally adjacent the horizontal conductive plate 439*a*, and a control element 25 is disposed between a face of the non-horizontal conductive panel 439*b* and a conductor 435 that is laterally adjacent the non-horizontal conductive panel 439*b*. A conductive via or pillar 441 is nested in the interior of the conductive tub 433 and passes through an aperture in the base of the conductive tub 433. The conductive pillar 441 and the conductive tub 433 form a conductive structure having a vertical extent.

As shown in FIGS. 11 and 12, memory cells can be formed on opposite sides of a conductive tub 433. Also, the memory cells can be formed in layers wherein a layer includes horizontally arranged conductive pillars 441 and memory cells, and wherein the layers are stacked so that corresponding conductive pillars 441 of different layers are stacked to form columns of conductive pillars 441. The columns of conductive pillars 441 can be vertical memory selection lines of a cubic memory structure, while the conductors 435 can be row memory selection lines.

The memory storage element 23 can be formed of an oxide of the laterally contiguous horizontal plate 439*a* while the control element 25 can be formed of an oxide of the laterally contiguous conductor 435. The memory storage element 23 can be formed of an oxide that is different from an oxide of the horizontal plate 439*a*, and the control element 25 can be formed of an oxide that is different from an oxide of the conductor 435. The memory storage element 23 can also be a portion of an unpatterned oxide layer that can be a deposited oxide layer or a completely oxidized deposited metal layer, for example. Similarly, the control element 25 can be a portion of an unpatterned oxide layer that can be a deposited oxide layer or a completely oxidized deposited metal layer, for example.

Figure 13:
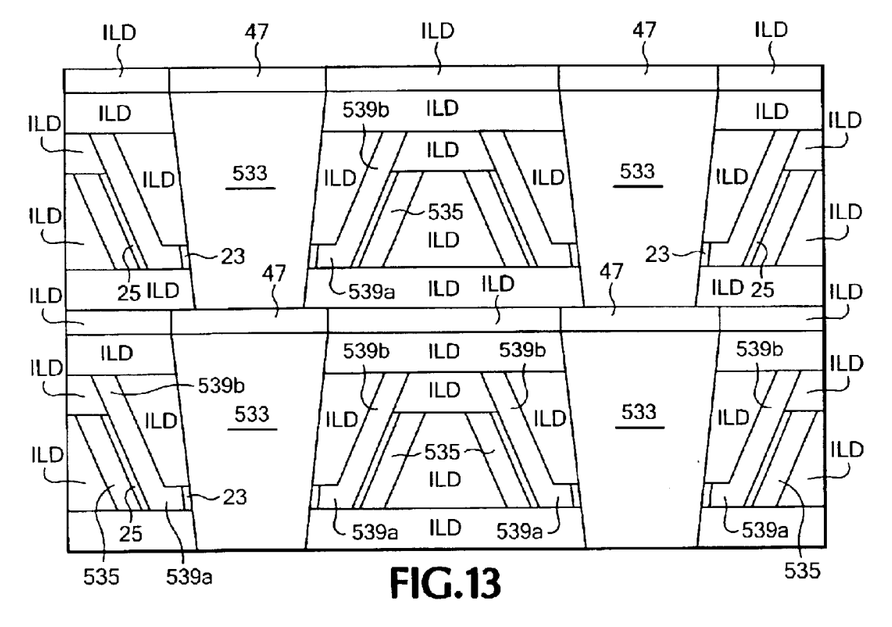
FIG. 13 is a sectional view and 14 is a plan view that schematically depict an embodiment of a memory structure that includes a buried memory storage element disposed between an edge of a conductive plate and a conductive pillar.
Figure 14:
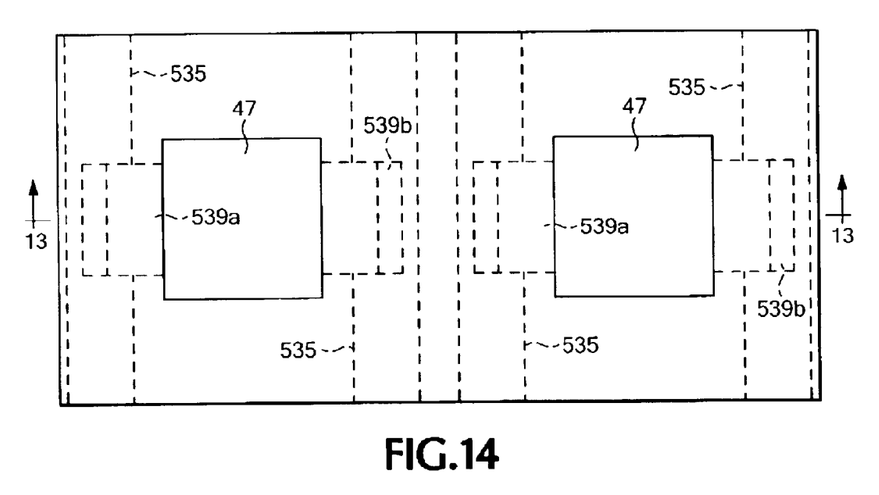

FIGS. 13 and 14 schematically depict an embodiment of a memory structure that includes memory cells each including a memory storage element 23 disposed between a vertical conductive via or pillar 533 and an edge of a horizontal conductive plate 539*a*. A non-horizontal conductive panel 539*b* is connected to and laterally adjacent the horizontal plate 539*a*, and a control element 25 is disposed between a face of the panel 539*b* and a face of a horizontally elongated conductive wall 535 that has a vertical extent and is laterally and laminarly adjacent the panel 539*b*. A via cap 47 comprising for example gold or titanium nitride is disposed on the top of the conductive pillar 533.

As shown in FIGS. 13 and 14, memory cells can be formed on opposite sides of a conductive pillar 533. Also, memory cells can be formed on laterally opposite sides of a region defined by adjacent elongated walls 535 that extend horizontally in the same direction. Further, the memory cells can be formed in layers wherein a layer includes horizontally arranged conductive pillars 533 and memory cells, and wherein the layers are stacked so that corresponding conductive pillars 533 of different layers are stacked to form columns of conductive pillars 533. The columns of conductive pillars 533 can be vertical memory selection lines of a cubic memory structure, while the elongated conductive walls 535 can be row memory selection lines.

The memory storage element 23 can be formed of an oxide of the laterally contiguous horizontal plate 539a while the control element 25 can be formed of an oxide of the laterally contiguous conductor 535. Alternatively, the memory storage element 23 can be formed of an oxide that is different from an oxide of the horizontal plate 539a, and the control element 25 can be formed of an oxide that is different from an oxide of the elongated conductive wall 535. The memory storage element 23 can also be a portion of an unpatterned oxide layer that can be a deposited oxide layer or a completely oxidized deposited metal layer, for example. Similarly, the control element 25 can be a portion of an unpatterned oxide layer that can be a deposited oxide layer or a completely oxidized deposited metal layer, for example.

Figure 15:
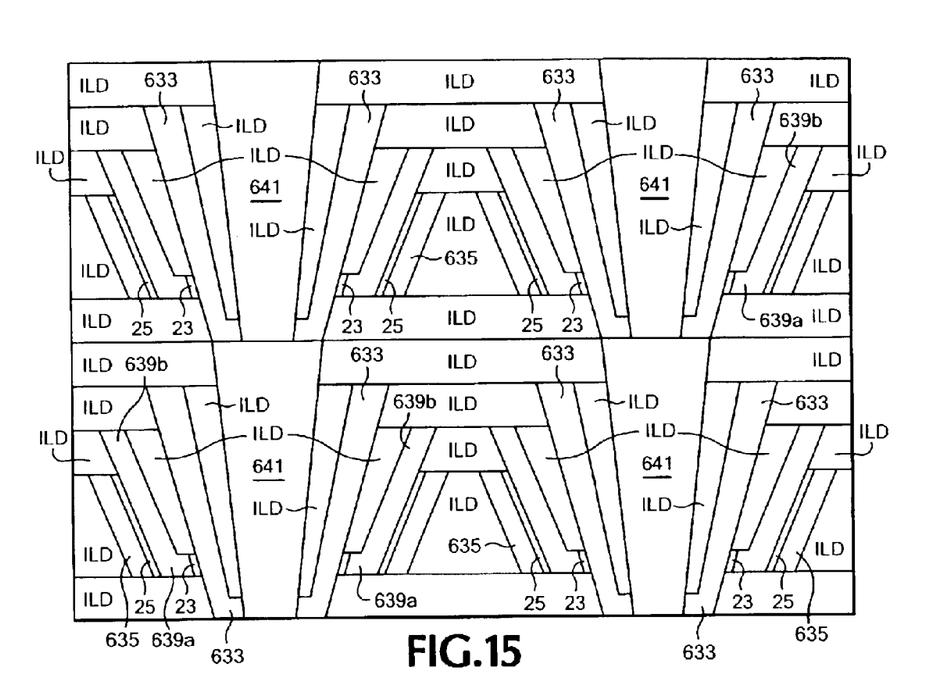
FIG. 15 is a sectional view and FIG. 16 is a plan view that schematically depict an embodiment of a memory structure that includes a buried memory storage element disposed between an edge of a conductive plate and a conductive well.
Figure 16:
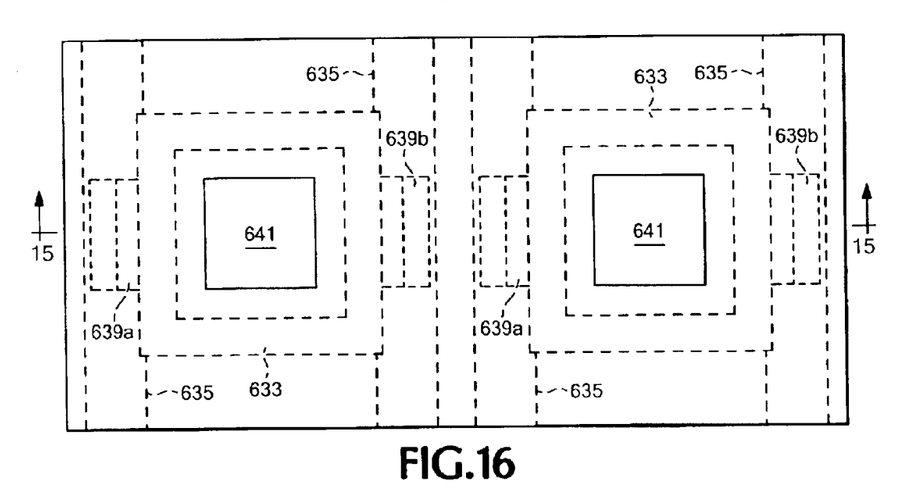

FIGS. 15 and 16 schematically depict an embodiment of a memory structure that includes memory cells each including a memory storage element 23 disposed between a conductive well or tub 633 and an edge of a horizontal conductive plate 639a. A non-horizontal conductive panel 639b is connected to and laterally adjacent the horizontal plate 639a, and a control element 25 is disposed between a face of the panel 639b and a face of an elongated conductive wall 635 that has a vertical extent and is laterally and laminarly adjacent the conductive panel 639b. A vertical conductive via or pillar 641 is disposed in the conductive tub 633 and contacts the tub at an opening in the base of the conductive tub, for example. The conductive pillar 641 and the conductive tub 633 form a conductive structure having a vertical extent.

As shown in FIGS. 15 and 16, memory cells can be formed on opposite sides of a conductive tub 633. Also, the memory cells can be formed in layers wherein a layer includes horizontally arranged conductive tubs 633 and memory cells, and wherein the layers are stacked so that corresponding conductive pillars 641 of different layers are stacked to form columns of conductive pillars 641. The columns of conductive pillars 641 can be vertical memory selection lines of a cubic memory structure, while the elongated conductive walls 635 can be row memory selection lines.

The memory storage element 23 can be formed of an oxide of the laterally contiguous horizontal plate 639a while the control element 25 can be formed of an oxide of the laterally contiguous conductor 635. Alternatively, the memory storage element 23 can be formed of an oxide that is different from an oxide of the horizontal plate 639a, and the control element 25 can be formed of an oxide that is different from an oxide of the elongated conductive wall 635. The memory storage element 23 can also be a portion of an unpatterned oxide layer that can be a deposited oxide layer or a completely oxidized deposited metal layer, for example. Similarly, the control element 25 can be a portion of an unpatterned oxide layer that can be a deposited oxide layer or a completely oxidized deposited metal layer, for example.

Figure 17:
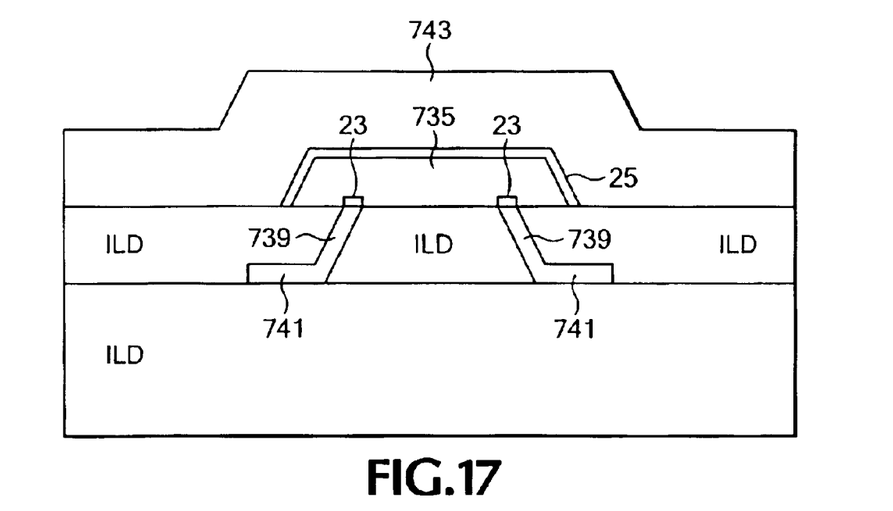
FIG. 17 is a sectional view and FIG. 18 is a plan view that schematically depict an embodiment of a memory structure that includes a buried memory storage element disposed between a rim of a truncated conductive cone and a conductive cap.
Figure 18:
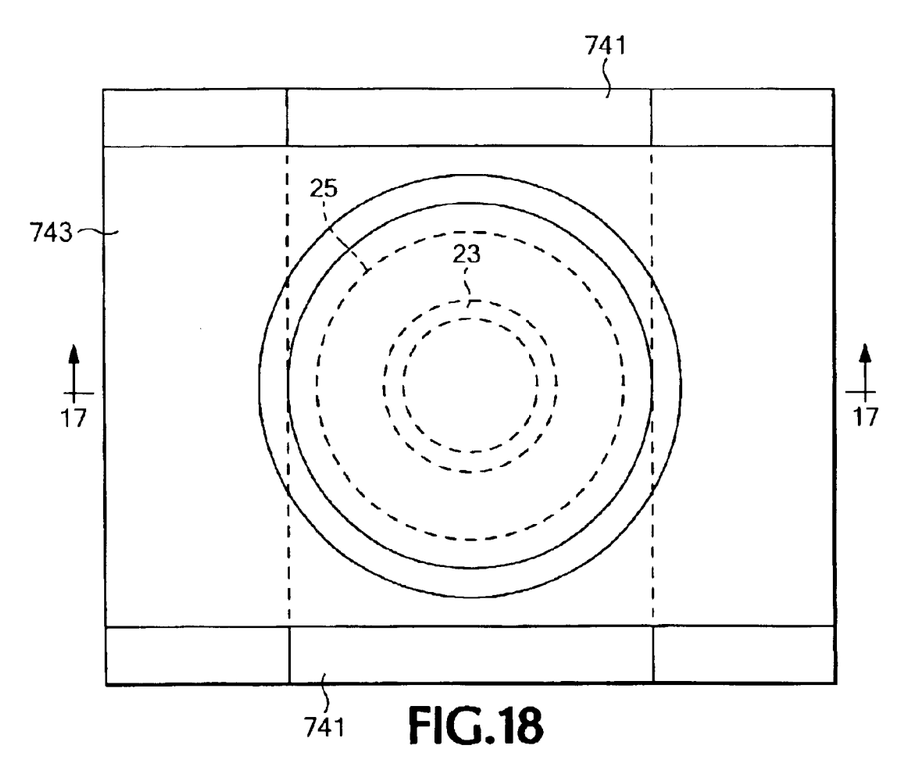

FIGS. 17 and 18 schematically depict an embodiment of a memory structure that includes memory cells each including a memory storage element 23 is disposed between a rim or edge of a conductive truncated cone 739 and a conductive cap 735. The truncated cone 739 is connected to an elongated conductor 741 that can be a memory selection line. A control element 25 is disposed between the conductive cap 735 and an elongated conductor 743 that overlies the conductive cap 735. The elongated conductor 743 can be a further memory selection line.

The memory storage element 23 can be formed of an oxide of the conductive truncated cone 739 while the control element 25 can be formed of an oxide of the conductive cap 735. Alternatively, the memory storage element 23 can be formed of an oxide that is different from an oxide of the truncated cone 739, and the control element 25 can be formed of an oxide that is different from an oxide of the conductive cap 735. The memory storage element 23 can also be a portion of an unpatterned oxide layer that can be a deposited oxide layer or a completely oxidized deposited metal layer, for example. Similarly, the control element 25 can be a portion of an unpatterned oxide layer that can be a deposited oxide layer or a completely oxidized deposited metal layer, for example.

Figure 19:
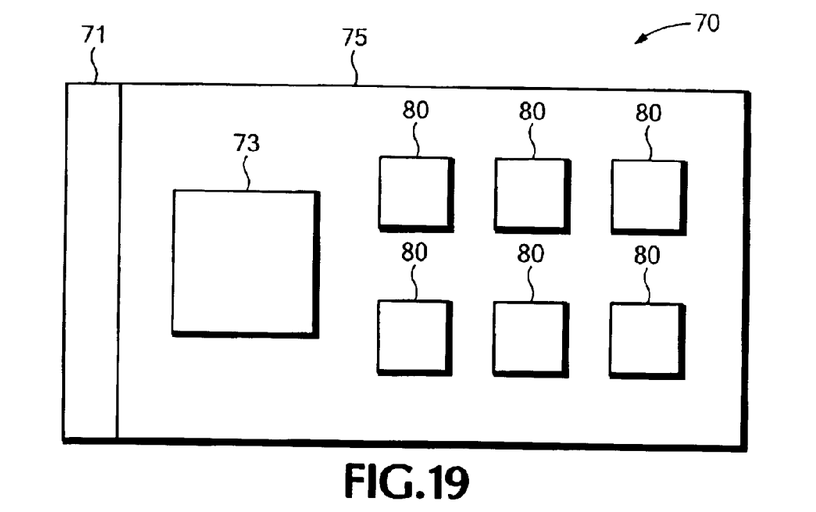
FIG. 19 is a schematic block diagram of an embodiment of a memory carrier that incorporates at least one of the disclosed memory cells.

FIG. 19 is a block diagram of an embodiment of a memory carrier 70 that incorporates at least one embodiment of the invention. The memory carrier represents any of standard or proprietary memory card formats such as PCMCIA, PC card, Smart memory, Memory Stick, digital film, ATA, and compact flash, to name a few. The memory carrier 70 includes a mechanical interface 71 that provides for mechanical and electrical connection with a particular connector for the type of memory carrier implemented. An optional electrical interface 73 makes electrical coupling with the electrical contacts on the mechanical connector 71 and provides for example security, address decoding, voltage translation, write protection, or other typical interface functions with a set of memory ICs 80 that incorporate at least one embodiment of the invention. A carrier 75, for example a printed circuit board or ceramic substrate, typically is used to physically support the memory ICs 80, electrical interface 73, and mechanical interface 71. It will be appreciated by those skilled in the art that some electrical devices might incorporate the functionality of the electrical interface 73, thereby obviating its need in the memory carrier 70.

Figure 20:
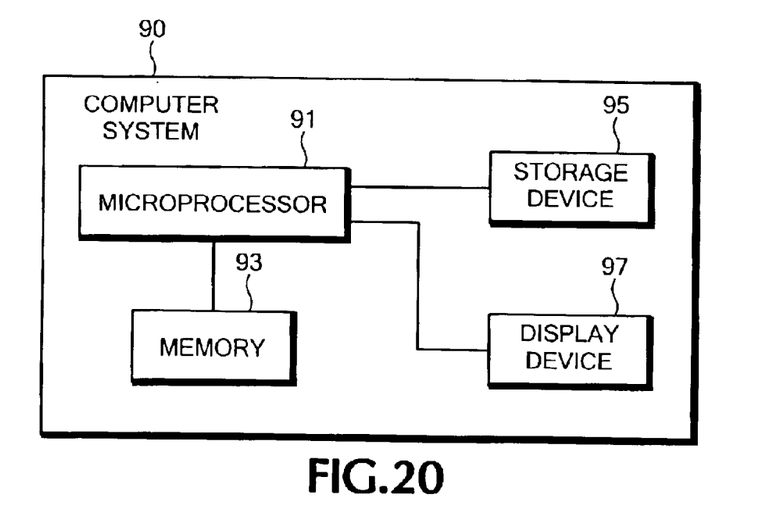
FIG. 20 is a schematic block diagram of an embodiment of an electronic device, such as a computer system, that incorporates at least one of the disclosed memory cells.

FIG. 20 is a block diagram of an embodiment of an electronic device, in this example a computer system 90, that incorporates at least one embodiment of the invention. In particular for a computer system, several different electrical devices as shown may be incorporated into the package. For example, a microprocessor 91 is coupled to a memory circuit 93 used to store computer executable instructions and/or user data. Exemplary memory circuits 93 include BIOS memory, random access memory (RAM), read only memory (ROM) and various levels of internal or external cache memory. The microprocessor 91 is also connected to a storage device 95 such as a hard disk drive, floppy drive, CD/DVD drive, tape drive or other mass storage devices such as those that incorporate semiconductor memory ICs that utilize the invention. The microprocessor 91 can include an internal cache memory that uses the invention. The memory 93 may also include memory ICs that use the invention. The microprocessor is further connected to a display device 97 that can also incorporate memory ICs that utilize the invention. The electronic device can also be configured to accept the memory carrier 70 of FIG. 19.

The disclosed memory structures can be implemented using semiconductor equipment. For example, the conductors can be formed by deposition of a metal layer followed by patterning by photolithographic masking and etching. Dielectric regions can be formed by deposition of dielectric material, while oxide layers can be formed by deposition of an oxide, deposition of a metal followed by oxidation of the deposited metal, or oxidation of a metal feature. Chemical mechanical polishing (CMP) can be employed to planarize and/or expose desired regions. Also, damascene processes such as dual damascene can be employed. In dual damascene processes, ILD is etched, metal is deposited on the etched ILD, and CMP is performed.

Figure 21:
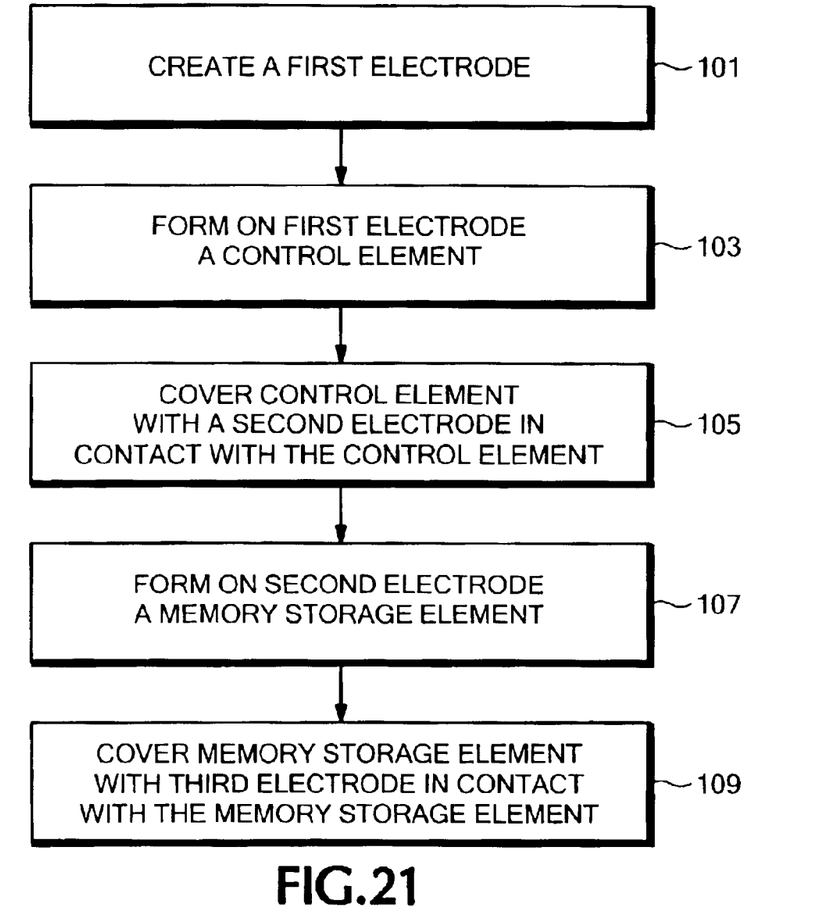
FIG. 21 is a flow diagram of an embodiment of basic steps that can be used to implement the disclosed memory structures.

Referring now to FIG. 21, the disclosed structures can generally be made as follows, for the illustrative example of making a buried memory storage element and a buried control element. At 101 a first electrode is created for example by depositing and patterning a metal layer. At 103 a control element is formed on the first electrode, for example by oxidizing the electrode or forming an unpatterned oxide layer as described above. At 105 the control element is covered with a second electrode to protect the control element from contamination, for example by depositing and patterning a metal layer. At 107 a memory storage element is formed on the second electrode, for example by oxidizing the electrode or forming an unpatterned oxide layer as described above. At 109 the memory storage element is covered with a third electrode so that the memory storage element is protected from contamination. By way of specific example, a memory storage tunnel junction oxide region can be formed and capped in vacuum without etching the memory storage tunnel junction oxide region, which reduces contamination of the memory tunnel junction oxide region. Similarly, a control tunnel junction oxide region can be formed and capped in vacuum without etching the control tunnel junction oxide region, which reduces contamination of the control junction oxide region. The formation of the memory storage element can be performed prior to formation of the control element.

Although the foregoing has been a description and illustration of specific embodiments of the invention, various modifications and changes thereto can be made by persons skilled in the art without departing from the scope and spirit of the invention as defined by the following claims.

What is claimed is:

1. A memory comprising:
   a first memory structure comprising:
   a first conductive region;
   a first conductive tub;
   a second conductive tub;
   a first memory storage element disposed between the first conductive region and the first conductive tub;
   a first control element disposed between the first conductive tub and the second conductive tub; and
   a first conductive via disposed in the second conductive tub; and
   a second memory structure comprising:
   a second conductive region;
   a third conductive tub;
   a fourth conductive tub;
   a second memory storage element disposed between the second conductive region and the third conductive tub;
   a second control element disposed between the third conductive tub and the fourth conductive tub; and
   a second conductive via disposed in the fourth conductive tub and in contact with the first conductive region,
   wherein the first memory structure is vertically adjacent the second memory structure.

2. The memory of claim 1, wherein the first memory structure is offset from the second memory structure.

3. The memory structure of claim 1, wherein the first memory storage element is protected from contamination during processing by one of the first conductive region, the first conductive tub, and the second conductive tub, and wherein the second memory storage element is protected from contamination during processing by one of the second conductive region, the third conductive tub, and the fourth conductive tub.

4. The memory structure of claim 1, wherein the first control element is protected from contamination during processing by one of the first conductive region, the first conductive tub, and the second conductive tub, and wherein the second control element is protected from contamination during processing by one of the second conductive region, the third conductive tub, and the fourth conductive tub.

5. The memory structure of claim 1, wherein the first memory storage element comprises an antifuse device.

6. The memory structure of claim 1, wherein the first memory storage element comprises a tunnel junction device.

7. The memory structure of claim 1, wherein the first memory storage element comprises one of an antifuse, a fuse, a charge storage device, a resistive material, a trap-induced hysteresis material, a ferroelectric capacitor material, a Hall effect material, and a tunneling magneto-resistive material.

8. The memory structure of claim 1, wherein the first memory storage element comprises an antifuse including material from the group consisting of an oxidized metal tunnel junction, a silicon dioxide tunnel junction, a dielectric-rupture, a polysilicon semiconductor, a polycrystalline semiconductor, an amorphous semiconductor, a microcrystalline semiconductor, a metal filament electromigration semiconductor, and a polysilicon resistor semiconductor.

9. The memory structure of claim 1, wherein the first memory storage element comprises a re-writable phase change material.

10. The memory structure of claim 1, wherein the first control element comprises a tunnel junction device.

11. The memory structure of claim 1, wherein the first control element comprises a diode.

12. The memory structure of claim 1, wherein the first control element comprises one of a recrystallized semiconductor, junction field effect transistor, a junction field effect transistor with its gate connected to its source or drain, a four-layer diode, an NPN transistor, and a PNP transistor.

13. The memory structure of claim 1, wherein the first memory storage element is protected from contamination during processing by one of the first conductive region, the second conductive region, the first conductive tub, and the second conductive tub.

14. The memory structure of claim 1, wherein the first control element is protected from contamination during processing by one of the first conductive region, the second conductive region, the first conductive tub, and the second conductive tub.

15. The memory structure of claim 1, wherein the first memory storage element comprises an oxide of a metal of the first conductive region.

* * * * *